(12) United States Patent
Labrie (10) Patent No.: US 6,590,509 B2
(45) Date of Patent: Jul. 8, 2003

(54) DATA RECOVERY THROUGH EVENT BASED EQUIVALENT TIME SAMPLING

(75) Inventor: Tad Labrie, Livermore, CA (US)

(73) Assignee: Credence Systems Corporation, Fremont, CA (US)

( * ) Notice: Subject to any disclaimer, the term of this patent is extended or adjusted under 35 U.S.C. 154(b) by 248 days.

(21) Appl. No.: 09/841,888

(22) Filed: Apr. 24, 2001

(65) Prior Publication Data

US 2002/0177969 A1 Nov. 28, 2002

(51) Int. Cl.$^7$ ............................................... H03M 5/08
(52) U.S. Cl. ........................................ 341/53; 702/72
(58) Field of Search ............................... 341/53; 702/69, 702/72

(56) References Cited

U.S. PATENT DOCUMENTS

| | | | | |
|---|---|---|---|---|
| 5,293,520 A | * | 3/1994 | Hayashi | .................. 324/76.77 |
| 5,315,299 A | * | 5/1994 | Matsumoto | .................. 341/53 |
| 5,436,853 A | * | 7/1995 | Shimohara | .................. 702/79 |
| 5,557,196 A | * | 9/1996 | Ujiie | ........................ 324/76.77 |
| 6,185,509 B1 | | 2/2001 | Wilstrup et al. | |
| 6,356,850 B1 | * | 3/2002 | Wilstrup et al. | .............. 702/69 |

* cited by examiner

*Primary Examiner*—Howard L. Williams
(74) *Attorney, Agent, or Firm*—Daniel J. Bedell; Smith-Hill and Bedell

(57) ABSTRACT

A system uses an event based equivalent time sampling method for ascertaining a value of each bit of a data frame repeated in a digital signal of indeterminate phase. The system measures time intervals between rising edges of the digital signal and a reference time and between falling edges of the digital and that reference time in response to pulses of a periodic arming signal. The measured time intervals are then normalized to equivalent time intervals and those intervals analyzed to determine values of each bit of the data frame.

30 Claims, 4 Drawing Sheets

DATA RECOVERY THROUGH EVENT BASED EQUIVALENT TIME SAMPLING

BACKGROUND OF THE INVENTION

1. Field of the Invention

The present invention relates to a system for determining values of data forming a data frame periodically repeating in a digital signal.

2. Description of Related Art

A typical digital tester tests a digital electronic device under test (DUT) by causing the DUT to produce one or more digital output signals and then periodically sampling each digital output signal to produce sample data representing values of data the digital output signal conveys. The tester then compares the sample data to data values the digital output signal is expected to convey to determine whether the DUT is operating properly.

Figure 1:
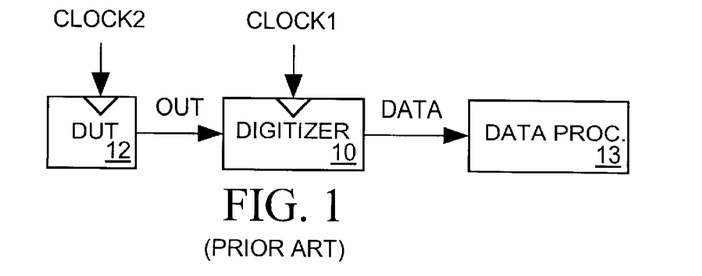
FIG. 1 is a block diagram of a prior art test system for testing the output signal of a digital device under test.

FIG. 1 illustrates a portion of a prior art test system including a digitizer 10 for sampling the digital output signal (OUT) of a DUT 12 on successive edges of a clock signal (CLOCK1) to produce sample data (DATA) supplied to a data processor 13 which then may compare the sample data to expected data values. A second clock signal (CLOCK2) controls the timing of state changes in the OUT signal.

Figure 2:
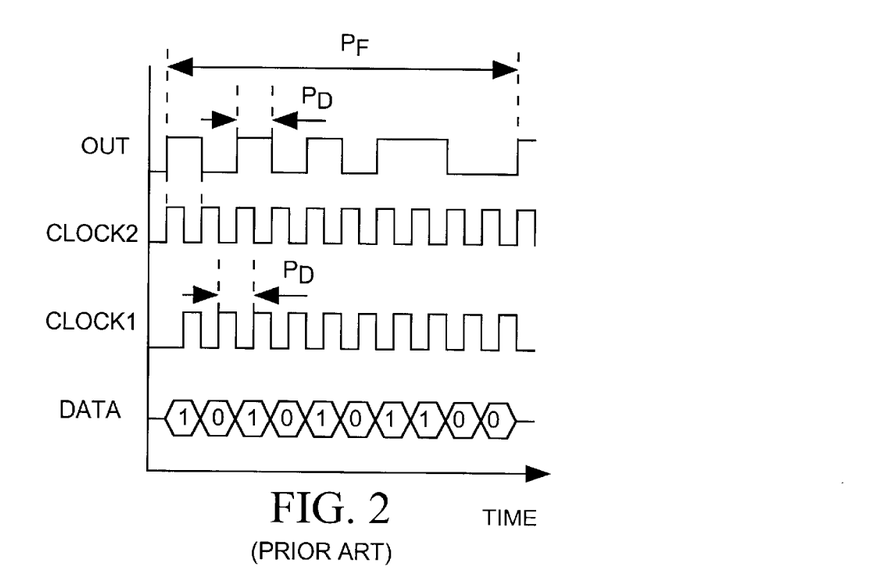
FIG. 2 is a timing diagram illustrating the timing of the signals of FIG. 1.

FIG. 2 is a timing diagram illustrating the OUT, CLOCK1 and CLOCK2 signals and the data output (DATA) produced by digitizer 10. The OUT signal may change state only in response to leading edges of the CLOCK2 signal. In this example the OUT signal conveys a data bit every PD seconds, the period of the CLOCK2 signal, and repeats a 10-bit data frame (1010101100) every $P_F$ seconds. With the CLOCK1 signal also having a period $P_D$ matching the length of one data cycle of the OUT signal, digitizer 10 can digitize the OUT signal in response to leading edges of ten successive pulses of the CLOCK1 signal to produce a sequence of ten output DATA bits indicating the 10-bit data pattern forming each data frame of the OUT signal.

Figure 3:
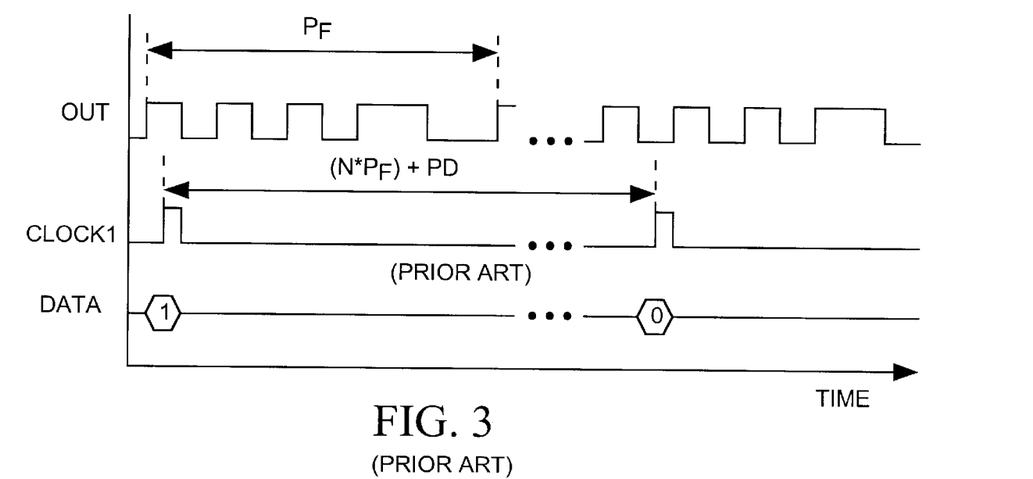
FIG. 3 is a timing diagram illustrating the timing of the signals of FIG. 1 when an equivalent time sampling procedure is used.

Digitizer 10 may implement equivalent time sampling when it is not capable of digitizing the OUT signal at a frequency as high as $1/P_D$. As illustrated in FIG. 3, the CLOCK1 signal period is increased to the sum of data period $P_D$ and an integer multiple N of frame period $P_F$. Ten successive CLOCK1 signal pulses will cause digitizer 10 to produce the same 10-bit DATA signal pattern as it would have produced had the CLOCK1 signal had a period of $P_D$ as in FIG. 2.

When using digitizer 10 to produce the DATA stream representing the OUT signal, it is necessary to adjust the CLOCK1 signal phase so that it samples the OUT signal at a point during each data cycle when the data bit is valid. However when the CLOCK1 and CLOCK2 signals are not coherent (i.e. not derived from the same source), the phase relationship between the OUT and CLOCK1 signals is indeterminate. Any device controlling the CLOCK1 signal phase will be unable to determine how to adjust the CLOCK1 signal phase because it will have no knowledge of the phase of the OUT signal. When the CLOCK1 and CLOCK2 signals are not closely synchronized, digitizer 10 may sample the OUT signal at a time when the OUT signal is undergoing a rising or falling edge transition and hence may produce an erroneous DATA output. Also in very high frequency applications a digitizer may not be able to sample the OUT signal with sufficient timing resolution.

What is needed is a system for recovering a repetitive data stream from a digital signal that does not require knowledge of the phase of the digital signal and that does not use a digitizer to sample the digital signal.

BRIEF SUMMARY OF THE INVENTION

In accordance with the invention, a system for ascertaining a value of each bit of a data frame of nominal duration $P_F$ periodically repeating in a digital signal and having a known data period $P_D$ produced by a device under test (DUT) includes a clock signal generator (CSG), a time interval analyzer (TIA) and a computer. The TIA measures time intervals $T_R(k)$ and $T_F(k)$ between a reference time and times of subsequent rising and falling edges of the digital signal measured in response to each $k^{th}$ pulse of a periodic arming signal (ARM) produced by the CSG. The period $P_A$ of the arming signal is:

$$P_A = NP_F + D_T$$

where N is any integer greater than 0 and $D_T$ is a "delta time" interval substantially smaller than $P_D$. With the ARM signal period set in this fashion, each successive ARM signal edge will fall at a different time relative to the start of an OUT signal frame. After many cycles of the ARM signal, the generated $T_R$ and $T_F$ data will include several measurements of the timing of each rising and falling edge of the data frame relative to the reference time. In accordance with the invention, the value of data conveyed in the data frame is determined from the generated $T_R$ and $T_F$ data.

It is accordingly an object of the invention to ascertain a value of all bits of a data stream conveyed in a digital signal produced by a DUT when the phase of the digital signal is indeterminate.

The claims portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DETAILED DESCRIPTION OF THE INVENTION

Figure 4:
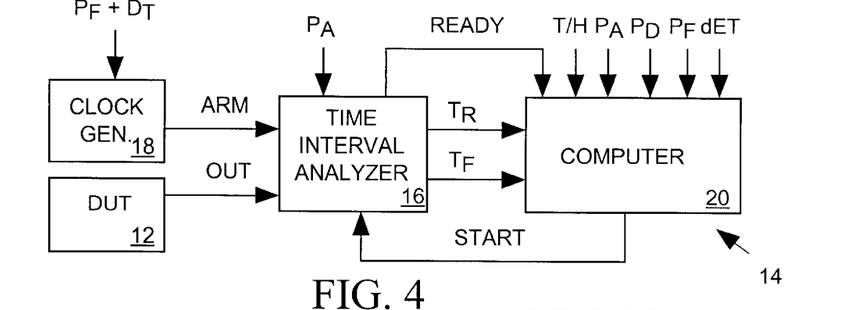
FIG. 4 is a block diagram illustrating a system for recovering data conveyed in a digital signal produced by a device under test using event based equivalent time sampling in accordance with the invention.

FIG. 4 illustrates a system 14 for determining, in accordance with the invention, a value of each data bit of a data frame repeating with period $P_F$ in an OUT signal produced by a DUT 12. Each data bit occupies a nominal time slot $P_D$ within the data frame. The OUT signal drives an input of a time interval analyzer (TIA) 16 such as a GuideTech Technology, Inc. model "Femto-2000", clocked by a periodic arming signal (ARM) produced by a programmable clock signal generator 18. TIA 16 supplies measurement data $T_R$ and $T_F$ to a computer 20 which determines the value of each data bit conveyed in the data frame from the measurement data.

Figure 5:
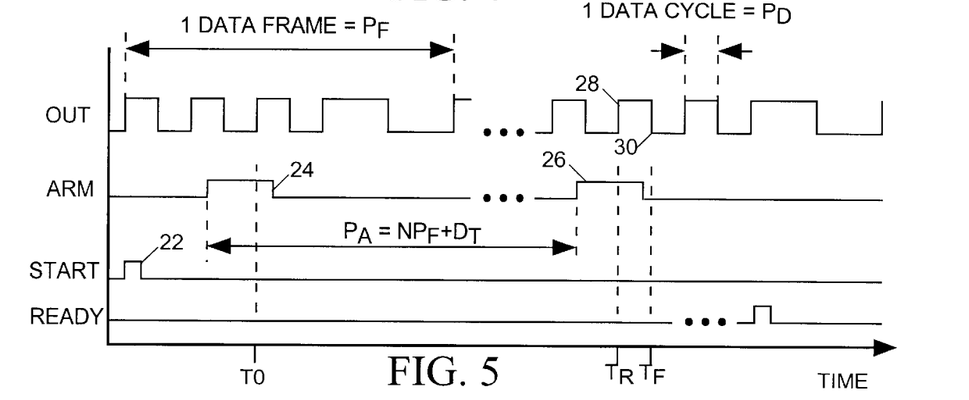
FIGS. 5 and 6 are timing diagrams illustrating the timing of signals of FIG. 4.

FIG. 5 is a timing diagram illustrating operation of TIA 16 of FIG. 4. When a computer 20 transmits a START signal pulse 22 to TIA 16, the TIA notes a time $T_0$ of a leading edge of the next occurring OUT signal pulse appearing after a leading edge of a first ARM signal pulse 24. Following a leading edge of a second ARM signal pulse 26, TIA 16 determines times (relative to $T_0$) of the next OUT signal rising and falling edges 28 and 30 and generates output data pairs $T_R$ and $T_F$ indicating those times. TIA 16 then pulses a READY signal input to computer 20 to indicate that it is currently producing output data. Computer 20 then acquires and stores the $T_R$ and $T_F$ data. TIA 16 continues to measure the delay between $T_0$ and rising and falling OUT signal edges following each successive leading edge of the periodic ARM signal, forwarding each $T_R$ and $T_F$ data pair to computer 20.

System 14 uses "event based equivalent time sampling" in accordance with the invention when measuring the timing of rising and falling edges of pulses occurring in a large number of data frames. Clock signal generator 18 is programmed to provide an ARM signal having period $P_A$ as follows:

$$P_A = NP_F + D_T$$

where N is an integer greater than 0 and $D_T$ is substantially smaller than a duration $P_D$ of one OUT signal data cycle. Setting the ARM signal period $P_A$ in this manner ensures that each successive ARM signal edge falls at a different time relative to a start of an OUT signal frame. After many cycles of the ARM signal, computer 20 will have received several sets of $T_R$ and $T_F$ data pairs indicating timing of many leading and trailing edges relative to $T_0$.

Knowing the values of $P_A$, $P_F$ and $D_T$, computer 20 calculates for each value of $T_R(k)$ and $T_F(k)$ acquired in response to a $k^{th}$ pulse of the ARM signal a pair of normalized or "equivalent" data values, $$T'_F(k) = T_F(k) - kNP_F,$$

$$T'_R(k) = T_R(k) - kNP_F.$$

Where $N = (P_A - D_T)/P_F$. The resulting $T'_F$ and $T'_R$ data sequences would be equivalent to $T_F$ and $T_R$ data sequences TIA 16 would have produced had the ARM signal had a period of $D_T$ as illustrated in FIG. 6, assuming TIA 16 were capable of responding to such a high frequency ARM signal by making several independent measurements of each OUT signal edge in response to each edge of a high frequency ARM signal.

Figure 6:
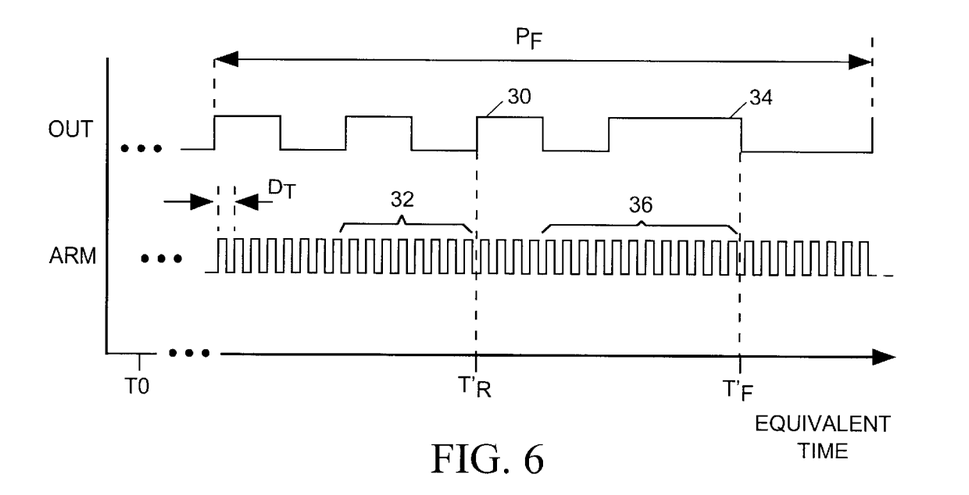

Note in FIG. 6 that several "equivalent time" ARM signal edges occur between each edge of the OUT signal. Thus, for example, we might expect that the normalized $T'_R$ data value for a rising edge of an OUT signal pulse 30 produced as a result of leading edges of several ARM signal pulses 32 to be the same. Similarly we would expect that the $T'_F$ data value for a falling edge of an OUT signal pulse 34 produced as a result of leading edges of several ARM signal pulses 36 to be the same.

Computer 20 calculates differences between successive $T'_D(k)$ and $T'_F(k)$ data values as follows:

$$D_R(k) = T'_R(k) - T'_R(k-1),$$

$$D_F(k) = T'_F(k) - T'_F(k-1)$$

Where $T'_R(0) = T'_F(0) = T(0)$. For example the quantity $D_R(1)$ represents the interval between the reference time $T_0$ and the first rising edge $T'_R(1)$ after the second ARM pulse.

Figure 7:
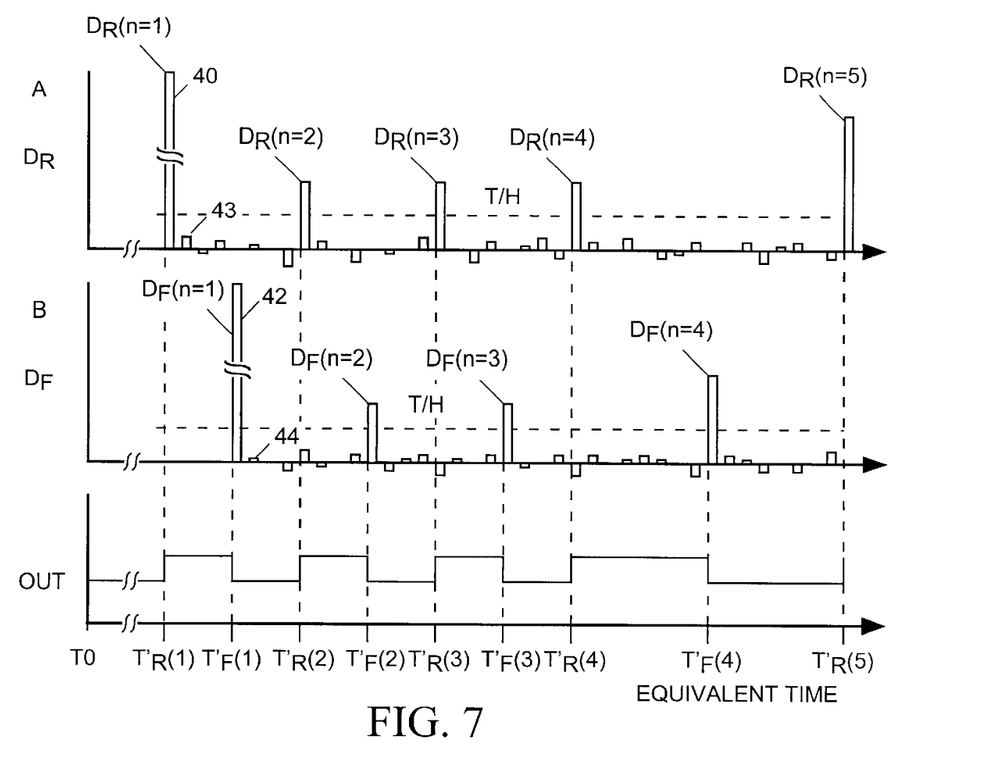
FIG. 7 is a timing diagram illustrating example data values produced by a first embodiment of the system of FIG. 4 as a function of equivalent time.

FIG. 7, graphs A and B, plot $D_R(k)$ and $D_F(k)$ as functions of equivalent time. A very tall bar 40 in plot A indicates a very large difference, $D_R(1)$, between the $T'_R(1)$ and $T'_R(0)$ data values. Similarly a very tall bar 42 in plot B indicates a very large difference, $D_F(1)$, between the $T'_F(1)$ and $T'_F(0)$ data values. Note that the $D_R(1)$ and $D_F(1)$ values are significantly larger than any other values in the corresponding $D_R(k)$ and $D_F(k)$ value sets. A small bar 43 in plot A represents a small difference $D_R(2)$ between the pair of data values $T'_R(2)$ and $T'_R(1)$. Similarly a small bar 44 in plot B represents a small difference $D_F(2)$ between the pair of data values $T'_F(2)$ and $T'_F(1)$.

Each $T'_R(k)$ or $T'_F(k)$ data value is based on a $T_R(k)$ or $T_F(k)$ measurement of the timing of the rising or falling edge of a separate OUT signal pulse employing the equivalent time measurement system illustrated in FIG. 5. If the OUT signal were perfectly periodic, then we would expect leading edges of all ARM signal pulses 32 (FIG. 6) occurring within one data cycle preceding a rising or falling edge of corresponding pulses within separate data frames to produce the same $T'_R$ or $T'_F$ data result. However when the OUT signal is somewhat jittery, edges of corresponding OUT signal pulses within successive frames may not occur at exactly the same times relative to the start of each frame. Hence, as illustrated in FIG. 7, plots A and B can include short bars 43 and 44 indicating edge timing differences due to jitter in the OUT signal edges. However when determining OUT signal edge timing from the plots, computer 20 ignores any bars 43 and 44 that do not rise above a predetermined threshold level (T/H). This effectively removes the impact of OUT signal jitter when computer 20 determines the timing of edges of the OUT signal as illustrated in FIG. 7.

Recovering the Data Frame

Computer 20 can use any of several methods to ascertain the value of bits forming the data frame conveyed in the OUT signal. Although the starting bit of the data frame is arbitrary, system 14 (FIG. 4) always begins a measurement cycle by first measuring an OUT signal rising edge subsequent to the second ARM pulse. Thus system 14 always chooses one of the bits of the data frame having a value "1" as the start of the data frame.

In a first method, computer 20 calculates a number J of data bits of value 1 with which the data frame begins:

$$J = RND((D_F(1) - D_R(1))/P_D).$$

Where RND is a rounding function returning the nearest integer value of its argument. The difference between $D_F(1)$ and $D_R(1)$ represents a time period at the start of the data frame during which the OUT signal was high. By dividing this difference by the nominal period $P_D$ of a single data bit we can determine the number J of bits of value 1 that start the data frame.

Computer 20 then calculates, for each successive nth value $D_R(n)$ or $D_F(n)$, for n>1, the following:

$$K(n)=RND(D_R(n)/P_D),$$

$$L(n)=RND(D_F(n)/P_D)$$

Each value K(n) represents a number of successive bits of the data frame of value "0". Each value L(n) represents a number of successive bits of the data frame of value "1".

Table I shows the series of numbers J, K(n) and L(n) that system 14 would calculate for the $D_R$ and $D_F$ data shown in FIG. 7:

TABLE I

| Number | Data | Value |
| --- | --- | --- |
| J | $(D_F(1) - D_R(1))/P_D$ | 1 (= 1 bit of "1") |
| K(2) | $D_R(n = 2)/P_D$ | 1 (= 1 bit of "0") |
| L(2) | $D_F(n = 2)/P_D$ | 1 (= 1 bit of "1") |
| K(3) | $D_R(n = 3)/P_D$ | 1 (= 1 bit of "0") |
| L(3) | $D_F(n = 3)/P_D$ | 1 (= 1 bit of "1") |
| K(4) | $D_R(n = 4)/P_D$ | 1 (= 1 bit of "0") |
| L(4) | $D_F(n = 4)/P_D$ | 2 (= 2 bits of "1") |
| K(5) | $D_R(n = 5)/P_D$ | 2 (= 2 bits of "0") |

Computer 20 completes calculation of the data values when:

$$J+\Sigma K(n)+\Sigma L(n)=P_F/P_D.$$

Thus computer 20 ascertains that the data sequence has the form (1010101100).

In an alternative method for calculating the values of bits of data frame based on the $D_R(n)$ and $D_F(n)$ values, computer 20 calculates numbers L(n) and K(n) of bits of subsequent 1 and 0 valued portions, respectively, of the data frame as follows:

$$L(n)=RND((T'_F(n)-T'_R(n))/P_D),$$

$$K(n)=RND((T'_R(n+1)-T'_F(n))/P_D)$$

Where $T'_F(n)$ is the equivalent time associated with $D_F(n)$ and $T'_R(n)$ is the equivalent time associated with $D_R(n)$. For example, the interval $T'_F(1)-T'_R(1)$ spans $P_D$, thus $L(1)=P_D/P_D=1$ and computer 20 determines that one bit of value 1 begins the data frame. The next portion of the data frame represented by the interval $T'_R(2)-T'_F(1)$ also spans $P_D$ and thus $K(1)=P_D/P_D=1$ and this portion is determined to have one bit of value 0 and so on. Table II shows the series of numbers L(n) and K(n) that system 14 would calculate for the $D_R$ and $D_F$ data shown in FIG. 7:

TABLE II

| Number | Data | Value |
| --- | --- | --- |
| L(1) | $(T'_F(1) - T'_R(1))/P_D$ | 1 (= 1 bit of "1") |
| K(1) | $(T'_R(2) - T'_F(1))/P_D$ | 1 (= 1 bit of "0") |
| L(2) | $(T'_F(2) - T'_R(2))/P_D$ | 1 (= 1 bit of "1") |
| K(2) | $(T'_R(3) - T'_F(2))/P_D$ | 1 (= 1 bit of "0") |
| L(3) | $(T'_F(3) - T'_R(3))/P_D$ | 1 (= 1 bit of "1") |
| K(3) | $(T'_R(4) - T'_F(3))/P_D$ | 1 (= 1 bit of "0") |
| L(4) | $(T'_F(4) - T'_R(4))/P_D$ | 2 (= 2 bits of "1") |
| K(4) | $(T'_R(5) - T'_F(4))/P_D$ | 2 (= 2 bits of "0") |

Figure 8:
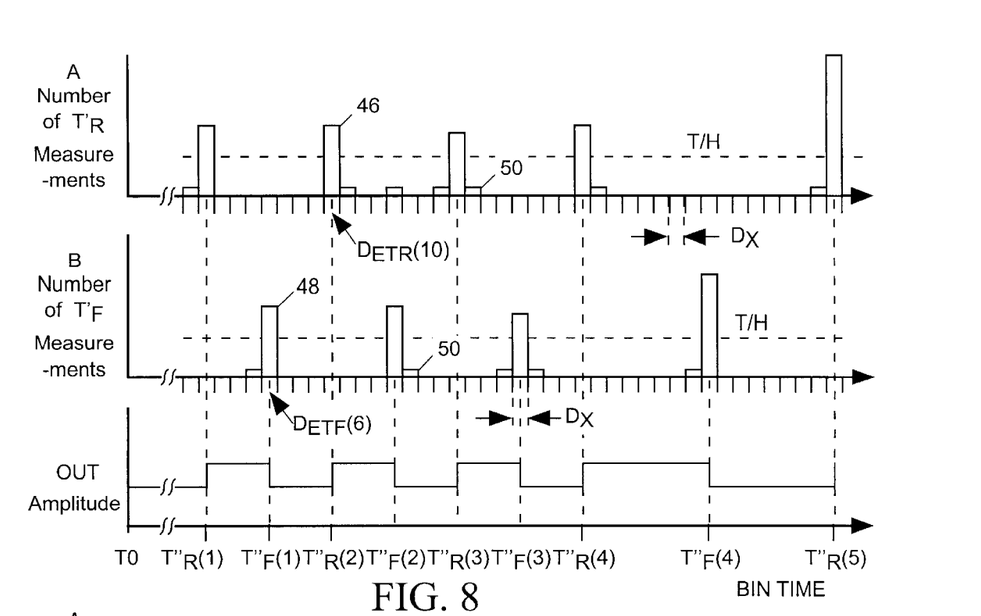
FIGS. 8 and 9 are timing diagrams illustrating example data values produced by a second embodiment of the system of FIG. 4 as a function of equivalent time.

FIG. 8, graphs A and B illustrate another method for extracting a data frame from the OUT signal that does not rely upon the calculation of difference values $D_R(k)$ and $D_F(k)$. In this method computer 20 divides equivalent time into a series of rising edge "bins" of width $D_X$ and then counts the number of equivalent time edge events $T'_R$ falling within each $m^{th}$ time bin $D_{ETR}(m)$. Computer 20 also divides equivalent time into a series of falling edge bins of width $D_X$ and then counts the number of equivalent time edge events $T'_F$ falling within each $m^{th}$ time bin $D_{ETF}(m)$. For example, a tall bar 46 in plot A of FIG. 8 indicates that computer 20 has collected a large number of $T'_R$ measurements falling within the associated $D_{ETR}(10)$ time bin. Similarly a tall bar 48 in plot B indicates that computer 20 has collected a large number of $T'_F$ measurements falling within a corresponding $D_{ETF}(6)$ time bin. Jitter in the OUT signal can move its edges in time and thus produce small bars 50 in plots A and B indicative of these displaced events.

Computer 20 counts the $T'_R(k)$ and $T'_F(k)$ events falling within each bin for a period of time. Computer 20 then assigns a corresponding bin time $T''_R(n)$ or $T''_F(n)$ to each time bin $D_{ETR}(m)$ or $D_{ETF}(m)$ which exceeds the T/H level. Computer 20 calculates, for each successive value of n, numbers L(n) and K(n) of bits of subsequent 1 and 0 valued portions, respectively, of the data frame:

$$L(n)=RND((T''_F(n)-T''_R(n))/P_D),$$

$$K(n)=RND((T''_R(n+1)-T''_F(n))/P_D).$$

By repeating the calculations of L(n) and K(n), computer 20 can fully ascertain the repetitive data sequence (1010101100) conveyed by each frame of the OUT signal. The values of L(n) and K(n) calculated using the method of FIG. 8 will be identical to those shown above in Table II.

Jitter Testing

Figure 9:
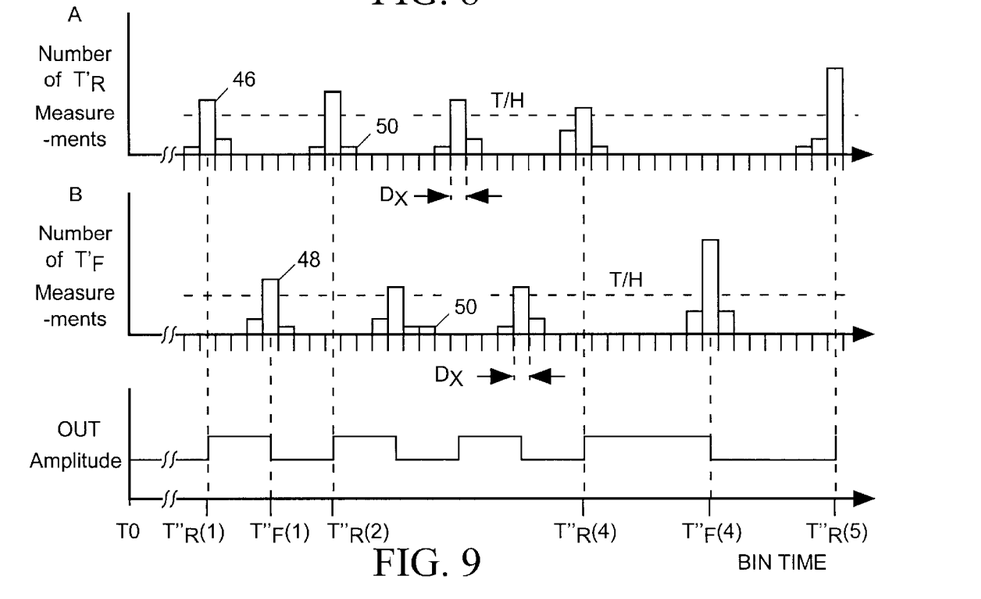

FIG. 9 shows how plots A and B of FIG. 8 would appear when the OUT signal is very jittery. Note plots A and B become somewhat flatter as fewer edges occur at times falling within bins spanning nominal edge times. However the nominal OUT signal edge timing can still be recovered, since in this example only the bars relating to appropriate edge times rise above threshold level T/H.

However for very high levels of OUT signal jitter plots A and B of FIG. 9 would become flatter still and bars 46, 48 relating to appropriate edge timing may fall below the threshold level, or bars 50 indicating displaced edge timing may rise above the threshold level. Computer 20 will then not be able to correctly determine the nominal OUT signal edge timing pattern and will therefore be unable to correctly reproduce the data pattern encoded into the OUT signal. Thus system 14 can be useful not only for determining whether the correct data pattern has been encoded into the OUT signal, but also, most effectively with the third method, to test for jitter in the OUT signal.

When determining OUT signal edge timing using the third method the combination of the time bin width $D_X$ and the threshold level T/H sets an effective timing jitter test level above which jitter in the OUT signal results in erroneous data recovery by system 14 (FIG. 4). If we want DUT 12 to pass the jitter test only when it has relatively little jitter, we set a narrow bin width $D_X$ and/or set the T/H level very low. A narrow bin width $D_X$ results in a greater number of small bars 40 for a given amount of jitter while a very low T/H level means that a relatively small bar 40 will cross the T/H level and be counted as indicating an edge. That will make the output DATA fail to match expected data. On the other hand, if we want to permit a relatively jittery OUT signal to pass the test, we set the T/H level somewhat higher and/or set a wider bin width $D_X$.

While the methods discussed above have been described in terms of operations performed by computer 20 of FIG. 4, those of ordinary skill in the art will recognize that computer 20 can be replaced by various equivalent systems of dedicated digital signal processing hardware that do not provide the computational capabilities and storage capacities of a typical computer. In particular the first and second methods described above can be performed on the fly using relatively simple digital signal processing hardware positioned close to the DUT.

Thus has been shown and described a system for recovering data from a digital signal when the phase of the digital signal is indeterminate. The system also allows for testing of DUTs for excessive output signal timing jitter.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method for ascertaining a value of each bit of a data frame of nominal duration $P_F$ periodically repeating in a digital signal, wherein each bit occupies a time slot of nominal duration $P_D$ within the data frame, wherein the digital signal conveys an alternating sequence of rising and falling edges representing state changes between successive bits of the data frame, the method comprising the steps of:
   a. measuring time intervals of said rising and falling edges relative to a reference time and generating timing data representing said time intervals, and
   b. ascertaining a value of each bit of the data frame from said timing data.

2. The method in accordance with claim 1 wherein step a comprises the sub-steps of:
   a1. generating successive pulses of a periodic arming signal; and
   a2. measuring, in response to each $k^{th}$ pulse of the arming signal, an interval $T_R(k)$ between the reference time and a time of a next rising edge of said data signal, and an interval $T_F(k)$ between the reference time and a time of a next falling edge of said data signal.

3. The method in accordance with claim 2 wherein said arming signal has a period $(N+X)*P_F$, wherein N is an integer at least as large as zero and wherein X is a number less than 1 and greater than 0.

4. The method in accordance with claim 3 wherein step b comprises the sub-steps of:
   b1. calculating for each value of k:

$T'_F(k)=T_F(k)-kNP_F,$ $T'_R(k)=T_R(k)-kNP_F,$ and
   b2. ascertaining a value of each bit of the data frame from values of $T'_R(k)$ and $T'_F(k)$ calculated at step b1.

5. The method in accordance with claim 4 wherein step b2 comprises the sub-steps of:
   b21. calculating for each value of k:

$D_R(k)=T'_R(k)-T'_R(k-1),$ $D_F(k)=T'_F(k)-T'_F(k-1),$ wherein $T'_R(0)=T'_F(0)=T(0)=0$; and
   b22. ascertaining a value of each bit of the data frame from values of $D_R(k)$ and $D_F(k)$ calculated at step b21.

6. The method in accordance with claim 5 wherein step b22 comprises the sub-steps of:
   b221. calculating from $D_R(1)$ and $D_F(1)$ a number J of successive first data bits of the data frame that are of a first state, wherein $J=RND((D_F(1)-D_R(1))/P_D),$ wherein RND is a rounding function rounding it's argument to a nearest integer value;
   b222. calculating, for each $n^{th}$ value $D_R(n)$ for which $D_R(k)>T/H$ and $n>1$, a number $K(n)$ of successive data bits of the data frame that are of a second state, wherein $K(n)=RND(D_R(k)/P_D),$ wherein T/H is a number greater than 0;
   b223. calculating, for each $n^{th}$ value $D_F(n)$ for which $D_F(k)>T/H$ and $n>1$, a number $L(n)$ of successive data bits of the data frame that are of the first state, wherein $L(n)=RND(D_F(k)/P_D);$ and
   b224. ascertaining a value of each bit of the data frame from numbers J, $K(n)$ and $L(n)$ calculated at steps b221, b222 and b223.

7. The method in accordance with claim 5 wherein step b22 comprises the sub-steps of:
   b221. generating, for each $n^{th}$ value of $D_R(k)$ for which $D_R(k)>T/H$, a value $T'_R(n)=T'_R(k)$, wherein T/H is a number greater than 0;
   b222. generating, for each $n^{th}$ value of $D_R(k)$ for which $D_F(k)>T/H$, a value $T'_F(n)=T'_F(k)$;
   b223. calculating, for each successive value of n, a number $L(n)$ of successive data bits of the data frame that are of the first state, wherein $L(n)=RND((T'_F(n)-T'_R(n))/P_D),$ wherein RND is a rounding function rounding it's argument to a nearest integer value;
   b224. calculating, for each successive value of n, a number $K(n)$ of successive data bits of the data frame that are of a second state, wherein $K(n)=RND((T'_R(n+1)-T'_F(n))/P_D);$ and
   b225. ascertaining a value of each bit of the data frame from numbers $L(n)$ and $K(n)$ calculated in steps b223 and b224.

8. The method in accordance with claim 4 wherein step b2 comprises the sub-steps of:
   b21. defining two sets of contiguous equivalent time bins $D_{ETR}(m)$ and $D_{ETF}(m)$, each set spanning an interval of $P_F$, wherein each said time bin spans less than $P_D$, wherein each time bin $D_{ETR}(m)$ represents a time $T''_R(m)$, wherein each time bin $D_{ETF}(m)$ represents a time $T''_F(m)$;
   b22. maintaining a separate $count_R(m)$ of each calculated value of $T'_R(k)$ falling within a corresponding time bin $D_{ETR}(m)$;
   b23. maintaining a separate $count_F(m)$ of each calculated value of $T'_F(k)$ falling within a corresponding time bin $D_{ETF}(m)$; and b24. ascertaining a value of each bit of the data frame from the counts $count_R(m)$ and $count_F(m)$.

9. The method in accordance with claim 8 wherein step b24 comprises the sub-steps of:

b241. generating, for each $n^{th}$ value of $count_R(m)$ for which $count_R(m)>T/H$, a value $T''_R(n)=T''_R(m)$, wherein T/H is a number greater than 0;

b242. generating, for each $n^{th}$ value of $count_F(m)$ for which $count_F(m)>T/H$, a value $T''_F(n)=T''_F(M)$;

b243. calculating for each of successive values of n a number L(n) of successive data bits of the data frame that are of the first state, wherein $$L(n)=RND((T''_F(n)-T''_R(n))/P_D),$$

wherein RND is a rounding function rounding it's argument to a nearest integer value;

b244. calculating for each of successive values of n a number K(n) of successive data bits of the data frame that are of a second state, wherein $$K(n)=RND((T''_R(n+1)-T''_F(n))/P_D);$$

and b245. ascertaining a value of each bit of the data frame from numbers L(n) and K(n) calculated in steps b243 and b244.

10. An apparatus for ascertaining a value of each bit of a data frame of nominal duration $P_F$ periodically repeating in a digital signal, wherein each bit occupies a time slot of nominal duration $P_D$ within the data frame, wherein the digital signal conveys an alternating sequence of rising and falling edges representing state changes between successive bits of the data frame, the apparatus comprising:

first means for measuring time intervals of said rising and falling edges relative to a reference time and generating timing data representing said time intervals, and second means for ascertaining a value of each bit of the data frame from said timing data.

11. The apparatus in accordance with claim 10 wherein said first means further comprises:

third means for generating successive pulses of a periodic arming signal, wherein said arming signal has a period $(N+X)*P_F$, wherein N is an integer at least as large as zero and wherein X is a number less than 1 and greater than 0; and fourth means for measuring, in response to each $k^{th}$ pulse of the arming signal, an interval $T_R(k)$ between the reference time and a time of a next rising edge of said data signal, and an interval $T_F(k)$ between the reference time and a time of a next falling edge of said data signal.

12. The apparatus in accordance with claim 11 wherein said second means calculates for each value of k:

$$T'_F(k)=T_F(k)-kNP_F,$$

$$T'_R(k)=T_R(k)-kNP_F,$$

wherein said second means then calculates for each value of k:

$$D_R(k)=T'_R(k)-T'_R(k-1),$$

$$D_F(k)=T'_F(k)-T'_F(k-1),$$

wherein $T'_R(0)=T'_F(0)=T(0)=0$, and wherein said second means then ascertains a value of each bit of the data frame from calculated values of $D_R(k)$ and $D_F(k)$.

13. The apparatus in accordance with claim 12 wherein said second means calculates a number J of successive data bits of the data frame that are of a first state, wherein $$J=RND((D_F(1)-D_R(1))/P_D),$$

wherein RND is a rounding function rounding it's argument to a nearest integer value;

wherein said second means then calculates, for each $n^{th}$ value $D_R(n)$ for which $D_R(k)>T/H$ and n>1, wherein T/H is a number greater than 0, a number K(n) of successive data bits of the data frame that are of a second state, wherein $$K(n)=RND(D_R(k)/P_D);$$

wherein said second means then calculates, for each $n^{th}$ value $D_F(n)$ for which $D_F(k)>T/H$ and n>1, a number L(n) of successive data bits of the data frame that are of the first state, wherein $$L(n)=RND(D_F(k)/P_D);$$

and wherein said second means then ascertains a value of each bit of the data frame from numbers J, K(n) and L(n).

14. The apparatus in accordance with claim 12 wherein said second means then generates, for each $n^{th}$ value of $D_R(k)$ for which $D_R(k)>T/H$, wherein T/H is a number greater than 0, a value $T'_R(n)=T'_R(k)$;

wherein said second means then generates, for each $n^{th}$ value of $D_F(k)$ for which $D_F(k)>T/H$, a value $T'_F(n)=T'_F(k)$ wherein said second means then calculates, for each successive value of n, a number L(n) of successive data bits of the data frame that are of the first state, wherein $$L(n)=RND((T'_F(n)-T'_R(n))/P_D),$$

wherein RND is a rounding function rounding it's argument to a nearest integer value;

wherein said second means then calculates, for each successive value of n, a number K(n) of successive data bits of the data frame that are of a second state, wherein $$K(n)=RND((T'_R(n+1)-T'_F(n))/P_D);$$

and wherein said second means then ascertains a value of each bit of the data frame from numbers L(n) and K(n).

15. The apparatus in accordance with claim 12 wherein said second means defines two sets of contiguous equivalent time bins $D_{ETR}(m)$ and $D_{ETF}(m)$, each set spanning an interval of $P_F$ wherein each said time bin spans less than $P_D$, wherein each time bin $D_{ETR}(m)$ represents a time $T''_R(m)$, wherein each time bin $D_{ETF}(m)$ represents a time $T''_F(m)$;

wherein said second means maintains a separate $count_R$ (m) of each calculated value of $T_R(k)$ falling within a corresponding time bin $D_{ETR}(m)$;

wherein said second means maintains a separate $count_F$ (m) of each calculated value of $T_F(k)$ falling within a corresponding time bin $D_{ETF}(m)$; and wherein said second means ascertains a value of each bit of the data frame from the counts $count_R(m)$ and $count_F(m)$.

16. The apparatus in accordance with claim 15 wherein said second means generates, for each $n^{th}$ value of $count_R(m)$ for which $count_R(m)>T/H$, a value $T''_R(n)=T''_R(m)$, wherein T/H is a number greater than 0;

wherein said second means generates, for each $n^{th}$ value of $count_F(m)$ for which $count_F(m)>T/H$, a value $T''_F(n)=T''_F(m)$;

wherein said second means calculates for each of successive values of n a number L(n) of successive data bits of the data frame that are of the first state, wherein $L(n)=RND((T''_F(n)-T''_R(n))/P_D)$, wherein RND is a rounding function rounding it's argument to a nearest integer value;

wherein said second means calculates for each of successive values of n a number K(n) of successive data bits of the data frame that are of a second state, wherein $K(n)=RND((T''_R(n+1)-T''_F(n))/P_D)$;

and wherein said second means ascertains a value of each bit of the data frame from numbers L(n) and K(n).

17. An apparatus for determining whether a digital signal has excessive jitter, wherein the digital signal conveys a periodically repeating data frame of nominal duration $P_F$, the data frame containing a first sequence of data bits, wherein each data bit occupies a time slot of nominal duration $P_D$ within the data frame, wherein the digital signal conveys an alternating sequence of rising and falling edges representing state changes between successive bits of the digital signal, the apparatus comprising:

first means for measuring time intervals of said rising and falling edges relative to a reference time and generating timing data representing said time intervals, second means for determining from said timing data a second sequence of data bits apparently contained in each data frame, and third means for comparing the first sequence to the second sequence to determine whether the digital signal has excessive jitter.

18. The apparatus in accordance with claim 17 wherein said first means further comprises:

fourth means for generating successive pulses of a periodic arming signal, wherein said arming signal has a period $(N+X)*P_F$, wherein N is an integer at least as large as zero and wherein X is a number less than 1 and greater than 0; and fifth means for measuring, in response to each $k^{th}$ pulse of the arming signal, an interval $T_R(k)$ between the reference time and a time of a next rising edge of said data signal, and an interval $T_F(k)$ between the reference time and a time of a next falling edge of said data signal.

19. The apparatus in accordance with claim 18 wherein said second means calculates for each value of k:

$T'_F(k)=T_F(k)-kNP_F$, $T'_R(k)=T_R(k)-kNP_F$, wherein said second means then calculates for each value of k:

$D_R(k)=T'_R(k)-T'_R(k-1)$, $D_F(k)=T'_F(k)-T'_F(k-1)$, wherein $T'_R(0)=T'_F(0)=T(0)=0$;

wherein said second means then determines from calculated values of $D_R(k)$ and $D_F(k)$ a second sequence of data bits apparently contained in each data frame; and wherein said third means compares the first sequence to the second sequence to determine whether the digital signal has excessive jitter.

20. The apparatus in accordance with claim 19 wherein said second means calculates a number J of successive first data bits of the digital signal that are of a first state, wherein $J=RND((D_F(1)-D_R(1))/P_D)$, wherein RND is a rounding function rounding it's argument to a nearest integer value;

wherein said second means then calculates, for each $n^{th}$ value of $D_R(n)$ for which $D_R(k)>T/H$ and $n>1$, a number K(n) of successive data bits of the digital signal that are of a second state, wherein $K(n)=RND(D_R(k)/P_D)$;

wherein said second means then calculates, for each $n^{th}$ value of $D_F(n)$ for which $D_F(k)>T/H$ and $n>1$, a number L(n) of successive data bits of the digital signal that are of the first state, wherein $L(n)=RND(D_F(k)/P_D)$;

wherein said second means then determines from numbers J, K(n) and L(n) a second sequence of data bits apparently contained in each data frame, and wherein said third means compares the first sequence to the second sequence to determine whether the digital signal has excessive jitter.

21. The apparatus in accordance with claim 19 wherein said second means then generates, for each $n^{th}$ value of $D_R(k)$ for which $D_R(k)>T/H$, wherein T/H is a number greater than 0, a value $T'_R(n)=T'_R(k)$;

wherein said second means then generates, for each $n^{th}$ value of $D_F(k)$ for which $D_F(k)>T/H$, a value $T'_F(n)-T'_F(k)$;

wherein said second means then calculates, for each successive value of n, a number L(n) of successive data bits of the digital signal that are of the first state:

$L(n)=RND((T'_F(n)-T'_R(n))/P_D)$, wherein RND is a rounding function rounding it's argument to a nearest integer value;

wherein said second means then calculates, for each successive value of n, a number K(n) of successive data bits of the digital signal that are of a second state, wherein $K(n)=RND((T'_R(n+1)-T'_F(n))/P_D)$;

and wherein said second means then determines from numbers L(n) and K(n) a second sequence of data bits apparently contained in each data frame and compares the first sequence to the second sequence to determine whether the digital signal has excessive jitter.

22. The apparatus in accordance with claim 19 wherein said second means defines two sets of contiguous equivalent time bins $D_{ETR}(m)$ and $D_{ETF}(m)$, each set spanning an interval of $P_F$, wherein each said time bin spans less than $P_D$, wherein each time bin $D_{ETR}(m)$ represents a time $T''_R(m)$, wherein each time bin $D_{ETF}(m)$ represents a time $T''_F(m)$;

wherein said second means maintains a separate $count_R(m)$ of each calculated value of $T'_R(k)$ falling within a corresponding time bin $D_{ETR}(m)$;

wherein said second means maintains a separate $count_F(m)$ of each calculated value of $T'_F(k)$ falling within a corresponding time bin $D_{ETF}(m)$;

wherein said second means then determines from the counts $count_R(m)$ and $count_F(m)$ a second sequence of data bits apparently contained in each data frame; and wherein said third means compares the first sequence to the second sequence to determine whether the digital signal has excessive jitter.

23. The apparatus in accordance with claim 22 wherein said second means generates, for each $n^{th}$ value of $count_R(m)$ for which $count_R(m) > T/H$, a value $T''_R(n) = T''_R(m)$, wherein T/H is a number greater than 0;

wherein said second means generates, for each $n^{th}$ value of $count_F(m)$ for which $count_F(m) > T/H$, a value $T''_F(n) = T''_F(m)$;

wherein said second means calculates for each of successive values of n a number L(n) of successive data bits of the data frame that are of the first state, wherein $$L(n) = RND((T''_F(n) - T''_R(n))/P_D),$$

wherein RND is a rounding function rounding it's argument to a nearest integer value;

wherein said second means calculates for each of successive values of n a number K(n) of successive data bits of the data frame that are of a second state, wherein $$K(n) = RND((T''_R(n+1) - T'_F(n))/P_D);$$

wherein said second means then determines from numbers L(n) and K(n) a second sequence of data bits apparently contained in each data frame, and wherein said third means compares the first sequence to the second sequence to determine whether the digital signal has excessive jitter.

24. A method for determining whether a digital signal has excessive jitter, wherein the digital signal nominally contains a periodically repeating data frame of nominal duration $P_F$, the data frame containing a first sequence of data bits, wherein each data bit occupies a time slot of nominal duration $P_D$ within the data frame, wherein the digital signal conveys an alternating sequence of rising and falling edges representing state changes between successive bits of the digital signal, the method comprising the steps of:

a. measuring time intervals of said rising and falling edges relative to a reference time and generating timing data representing said time intervals, b. determining from said timing data a second sequence of data bits apparently contained in each data frame, and c. comparing the first sequence to the second sequence to determine whether the digital signal has excessive jitter.

25. The method in accordance with claim 24 wherein step a comprises the sub-steps of:

a1. generating successive pulses of a periodic arming signal, wherein said arming signal has a period (N+X)*$P_F$, wherein N is an integer at least as large as zero and wherein X is a number less than 1 and greater than 0; and a2. measuring, in response to each $k^{th}$ pulse of the arming signal, an interval $T_R(k)$ between the reference time and a time of a next rising edge of said data signal, and an interval $T_F(k)$ between the reference time and a time of a next falling edge of said data signal.

26. The method in accordance with claim 25 wherein step b comprises the sub-steps of:

b1. calculating for each value of k:

$$T'_F(k) = T_F(k) - kNP_F,$$

$$T'_R(k) = T_R(k) - kNP_F,$$

b2. calculating for each value of k:

$$D_R(k) = T'_R(k) - T'_R(k-1),$$

$$D_F(k) = T'_F(k) - T'_F(k-1),$$

wherein $T'_R(0) = T'_F(0) = T(0) = 0$; and b3. determining from values of $D_R(k)$ and $D_F(k)$ calculated in step b2 a second sequence of data bits apparently contained in each data frame.

27. The method in accordance with claim 26 wherein step b3 comprises the sub-steps of:

b31. calculating a number J of successive first data bits of the digital signal that are of a first state, wherein $$J = RND((D_F(1) - D_R(1))/P_D),$$

wherein RND is a rounding function rounding it's argument to a nearest integer value;

b32. calculating, for each $n^{th}$ value of $D_R(n)$ for which $D_R(k) > T/H$ and n > 1, wherein T/H is a number greater than 0, a number K(n) of successive data bits of the digital signal that are of a second state, wherein $$K(n) = RND(D_R(k)/P_D);$$

b33. calculating, for each $n^{th}$ value of $D_F(n)$ for which $D_F(k) > T/H$ and n > 1, a number L(n) of successive data bits of the digital signal that are of the first state, wherein $$L(n) = RND(D_F(k)/P_D);$$

and b34. determining from numbers J, K(n) and L(n), calculated in steps b31, b32 and b33, a second sequence of data bits apparently contained in each data frame.

28. The method in accordance with claim 26 wherein step b3 comprises the sub-steps of:

b31. generating, for each $n^{th}$ value of $D_R(k)$ for which $D_R(k) > T/H$, wherein T/H is a number greater than 0, a value $T'_R(n) = T'_R(k)$;

b32. generating, for each $n^{th}$ value of $D_F(k)$ for which $D_F(k) > T/H$, a value $T'_F(n) = T'_F(k)$;

b33. calculating, for each successive value of n, a number L(n) of successive data bits of the digital signal that are of the first state:

$$L(n) = RND((T'_F(n) - T'_R(n))/P_D),$$

wherein RND is a rounding function rounding it's argument to a nearest integer value;

b34. calculating, for each successive value of n, a number K(n) of successive data bits of the digital signal that are of a second state, wherein $$K(n)=RND((T'_R(n+1)-T'_F(n))/P_D);$$

and b35. determining from numbers L(n) and K(n), calculated in steps b33 and b34, a second sequence of data bits apparently contained in each data frame.

29. The method in accordance with claim 26 wherein step b3 comprises the sub-steps of:

b31. defining two sets of contiguous equivalent time bins $D_{ETR}(m)$ and $D_{ETF}(m)$, each set spanning an interval of $P_F$, wherein each said time bin spans less than $P_D$, wherein each time bin $D_{ETR}(m)$ represents a time $T''_R(m)$, wherein each time bin $D_{ETF}(m)$ represents a time $T''_F(m)$;

b32. maintaining a separate $count_R(m)$ of each calculated value of $T'_R(k)$ falling within a corresponding time bin $D_{ETR}(m)$;

b33. maintaining a separate $count_F(m)$ of each calculated value of $T'_F(k)$ falling within a corresponding time bin $D_{ETF}(m)$; and b34. determining from the counts $count_R(m)$ and $count_F(m)$ a second sequence of data bits apparently contained in each data frame.

30. The method in accordance with claim 29 wherein step b34 comprises the sub-steps of:

b341. generating, for each $n^{th}$ value of $count_R(m)$ for which $count_R(m)>T/H$, a value $T''_R(n)=T''_R(m)$, wherein T/H is a number greater than 0;

b342. generating, for each $n^{th}$ value of $count_F(m)$ for which $count_F(m)>T/H$, a value $T''_F(n)=T''_F(M)$;

b343. calculating for each of successive values of n a number L(n) of successive data bits of the data frame that are of the first state, wherein $$L(n)=RND((T''_F(n)-T''_R(n))/P_D),$$

wherein RND is a rounding function rounding it's argument to a nearest integer value;

b344. calculating for each of successive values of n a number K(n) of successive data bits of the data frame that are of a second state, wherein $$K(n)=RND((T''_R(n+1)-T''_F(n))/P_D);$$

and b345. determining from numbers L(n) and K(n), calculated in steps b343 and b344, a second sequence of data bits apparently contained in each data frame.

* * * * *